United States Patent
Kim et al.

(10) Patent No.: US 9,129,978 B1
(45) Date of Patent: Sep. 8, 2015

(54) INTEGRATED CIRCUIT PACKAGING SYSTEM WITH VOID PREVENTION MECHANISM AND METHOD OF MANUFACTURE THEREOF

(71) Applicants: Jaepil Kim, Icheon-si (KR); Seokhyun Kim, Gyeongju-si (KR); Daeup Bae, Seoul (KR); Jaewon Kim, Seoul (KR); Jaekang Yoo, Icheon-si (KR); Sungpil Hur, Icheon-si (KR)

(72) Inventors: Jaepil Kim, Icheon-si (KR); Seokhyun Kim, Gyeongju-si (KR); Daeup Bae, Seoul (KR); Jaewon Kim, Seoul (KR); Jaekang Yoo, Icheon-si (KR); Sungpil Hur, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/313,521

(22) Filed: Jun. 24, 2014

(51) Int. Cl.
  *H01L 23/48* (2006.01)
  *H01L 23/28* (2006.01)
  *H01L 21/44* (2006.01)
  *H01L 21/56* (2006.01)

(52) U.S. Cl.
  CPC ............ *H01L 21/563* (2013.01); *H01L 21/565* (2013.01); *H01L 21/568* (2013.01)

(58) Field of Classification Search
  CPC ......... H01L 24/97; H01L 23/13; H01L 25/50; H01L 21/565; H01L 21/568
  USPC ............ 257/787, E23.116, E21.502; 438/127
  See application file for complete search history.

(56) References Cited

U.S. PATENT DOCUMENTS

| | | | |
|---|---|---|---|
| 6,200,121 B1 * | 3/2001 | Tsuruta .......................... | 425/127 |
| 6,262,490 B1 * | 7/2001 | Hsu et al. ....................... | 257/787 |
| 6,519,844 B1 * | 2/2003 | Nagarajan et al. .............. | 29/841 |
| 6,767,767 B2 * | 7/2004 | Hayashida et al. ............ | 438/124 |
| 6,969,918 B1 * | 11/2005 | James et al. .................... | 257/787 |
| 7,288,843 B2 | 10/2007 | Prior et al. | |
| 8,198,143 B2 | 6/2012 | Eu et al. | |
| 8,351,217 B2 | 1/2013 | Watanabe | |
| 2006/0261498 A1 * | 11/2006 | James .............................. | 257/787 |
| 2010/0117202 A1 * | 5/2010 | Eu et al. ......................... | 257/622 |

* cited by examiner

*Primary Examiner* — Nitin Parekh
(74) *Attorney, Agent, or Firm* — Ishimaru & Associates LLP (57) ABSTRACT

An integrated circuit packaging system, and a method of manufacture of an integrated circuit packaging system thereof, includes: a singulation substrate having an air vent portion having longitudinal grooves in the air vent portion, the longitudinal grooves all parallel to each other; an integrated circuit die attached to the singulation substrate; and a molding compound on the singulation substrate, on the air vent portion, in a portion of the longitudinal grooves, and on the integrated circuit die.

10 Claims, 6 Drawing Sheets

INTEGRATED CIRCUIT PACKAGING SYSTEM WITH VOID PREVENTION MECHANISM AND METHOD OF MANUFACTURE THEREOF

TECHNICAL FIELD

The present invention relates generally to an integrated circuit packaging system, and more particularly to a system for wafer-scale manufacturing.

BACKGROUND ART

Semiconductor chips have become progressively more complex, driven in large part by the need for increasing processing power in a smaller chip size for compact or portable electronic devices such as cell phones, smart phones, personal media systems, or ultraportable computers.

As sizes of chips and chip packages shrink, spaces between components also shrink. During certain types of molding processes, it is expected that molding compound will fill every space between components, leaving no air pockets or voids that can cause damage upon later operation of a chip package. However, because spaces between components are becoming increasingly smaller, there is an increased chance of improper ventilation leading to trapped air pockets in the molding compound.

Thus, a need still remains for a better method of manufacturing which avoids leaving air pockets. In view of the shrinking sizes of electronic components, it is increasingly critical that answers be found to these problems. Growing consumer expectations and the diminishing opportunities for meaningful product differentiation in the marketplace make it critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system that includes providing a mold chase having an air vent; providing a singulation substrate having an air vent portion; forming longitudinal grooves in the air vent portion of the singulation substrate, the longitudinal grooves all parallel to each other; positioning the singulation substrate in the mold chase; attaching an integrated circuit die to the singulation substrate; and flowing a molding compound on the singulation substrate and the integrated circuit die, the molding compound flowing over the air vent portion of the singulation substrate and into a portion of the longitudinal grooves, the molding compound pushing air out of the mold chase in the air flow direction through the longitudinal grooves.

The present invention provides an integrated circuit packaging system that includes a singulation substrate having an air vent portion having longitudinal grooves in the air vent portion, the longitudinal grooves all parallel to each other; an integrated circuit die attached to the singulation substrate; and a molding compound on the singulation substrate, on the air vent portion, in a portion of the longitudinal grooves, and on the integrated circuit die.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the singulation substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element. The term "longitudinal" and "transverse" refer to directions parallel to and perpendicular to, respectively, the natural path of vented air.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Figure 1:
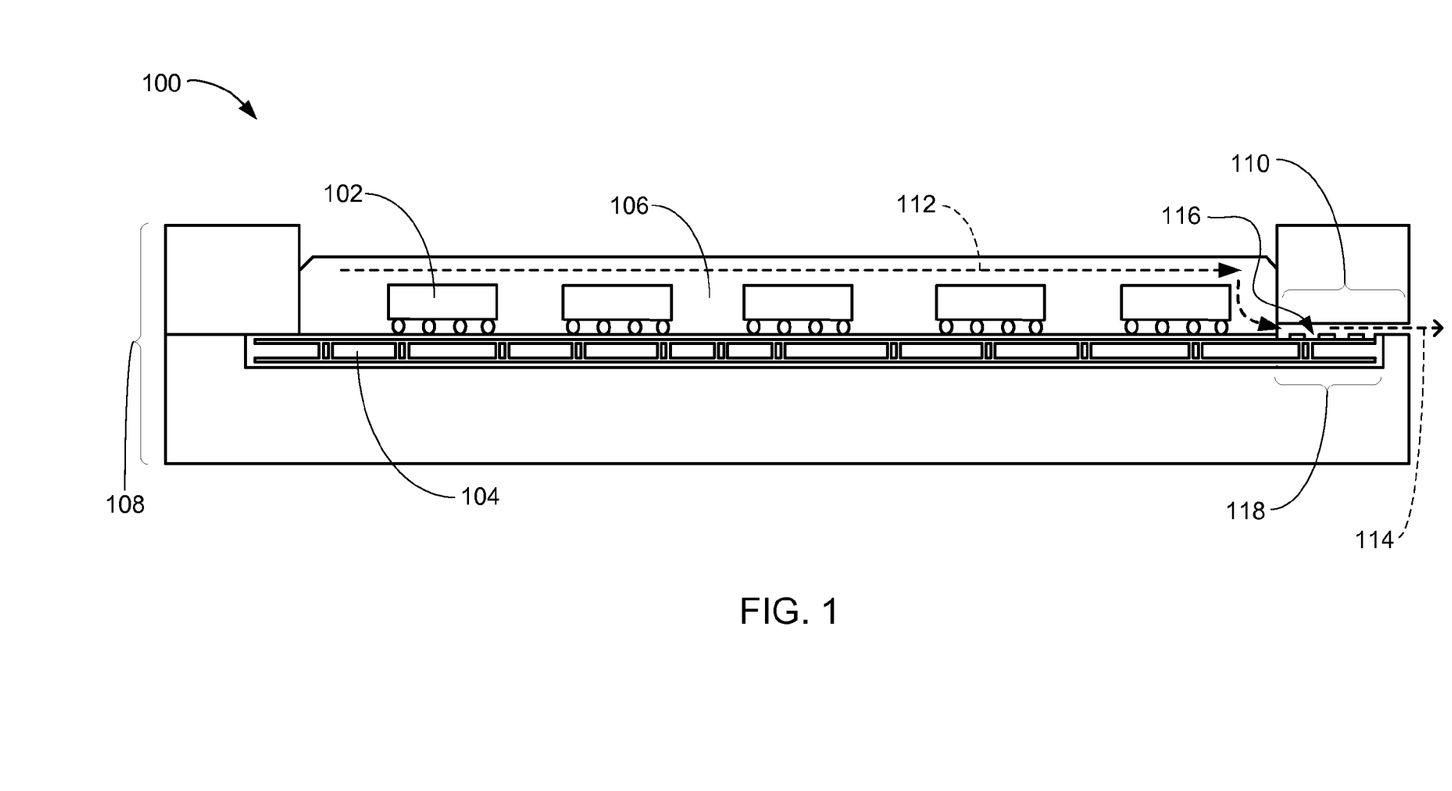
FIG. 1 is a cross-sectional view of an integrated circuit packaging system in a first embodiment of the present invention.

Referring now to FIG. 1, therein is shown a cross-sectional view of an integrated circuit packaging system 100 in a first embodiment of the present invention. Shown are integrated circuit dies 102 on a singulation substrate 104. The integrated circuit dies 102 are shown as flip chips, but it is understood that any other kind of integrated circuit die is possible, such as wire-bond dies. The singulation substrate 104 is a substrate large enough to mount more than one of the integrated circuit dies 102 for later singulation through the substrate to complete an integrated circuit package.

The integrated circuit dies 102 are covered with a molding compound 106 such as moldable underfill or other moldable encapsulation. The singulation substrate 104 is directly on a mold chase 108 which defines the shape of the molding compound 106. The mold chase 108 is shown with an upper clamping portion and a bottom holding portion. The bottom holding portion holds the singulation substrate 104 from the bottom while the upper clamping portion is placed over the top and defines where the sides of the molding compound 106 will end up. An air vent 110 between the upper clamping portion and the bottom holding portion of the mold chase 108 allows for air to be pushed out of the space where the molding compound 106 will flow.

The dotted solid arrows show a mold flow direction 112 of the molding compound 106. As the molding compound 106 flows over and around the integrated circuit dies 102 and the singulation substrate 104, the air vent 110 is necessary for smooth flow of the molding compound 106. The dotted open arrow shows an air flow direction 114 out of the mold chase 108 as the molding compound 106 flows into the mold chase 108. The singulation substrate 104 has grooves 116 in the top layer of an air vent portion 118 of the singulation substrate 104 which is within the air vent 110. In order to ensure full coverage of the integrated circuit dies 102, enough of the molding compound 106 can be used such that the molding compound 106 can flow into the air vent 110 and onto a portion of the air vent portion 118 of the singulation substrate 104, along with filling a portion of the grooves 116.

It has been discovered that the grooves 116 on the air vent portion 118 of the singulation substrate 104 within the air vent 110 reduce the incidence and severity of air pockets that can form under the integrated circuit dies 102. Because the space under the integrated circuit dies 102 is very small, if the air vent 110 is obstructed or rendered smaller than expected due to high clamping force or local substrate thickness variance, air flow can be obstructed. Obstructed air flow can increase the chance that air will not be properly vented from under the integrated circuit dies 102, leading to air pockets and later damage to the integrated circuit packages. The grooves 116 in the air vent portion 118 can help ensure proper air flow even when the mold chase 108 is clamped with too much force.

Once the molding compound 106 has been flowed over and on the integrated circuit dies 102 and the singulation substrate 104, the molding compound 106 can be hardened through drying or curing processes, for example. Individual integrated circuit packages can be formed by cutting the molding compound 106 and the singulation substrate 104 between the integrated circuit dies 102.

Figure 2:
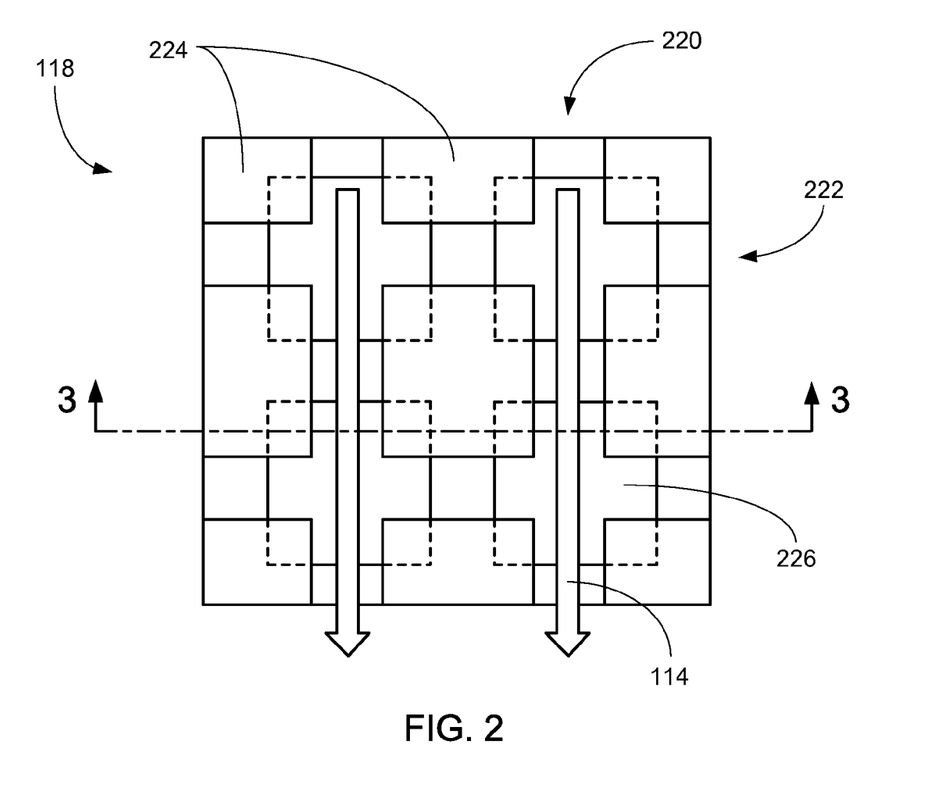
FIG. 2 is a top view of a portion of the air vent portion.

Referring now to FIG. 2, therein is shown a top view of a portion of the air vent portion 118. In this view, longitudinal grooves 220 and transverse grooves 222 can be seen in a dielectric layer 224. It is understood that only a small portion of the air vent portion 118 is shown, and that the pattern can be repeated as necessary to fill all of the air vent portion 118. The longitudinal grooves 220 and the transverse grooves 222 can correspond to the grooves 116 of FIG. 1.

In portions of the singulation substrate 104 of FIG. 1 which have no electrical function (for example, for portions unconnected to any of the integrated circuit dies 102 of FIG. 1), a dummy pattern can be formed inside the dielectric layer 224. The dielectric layer 224 can be a material such as a prepreg composite, a solder resist, or other insulative material, for example. In this example, the dummy pattern is a grid of metallic blocks 226 which can serve to improve stiffness while also preventing thermal expansion and contraction issues. The dielectric layer 224 is formed entirely around the metallic blocks 226.

The metallic blocks 226 in this example are made of copper, but it is understood that any metal may be used as necessary. The dummy pattern in this example is a grid of the metallic blocks 226 unconnected to each other, but it is understood that the dummy pattern can be formed differently. For example, the dummy pattern can be a grid of circular metallic pads, a continuous metallic grid oriented in any direction, or any other regular pattern.

The longitudinal grooves 220 and the transverse grooves 222 are formed in the dielectric layer 224 to intersect over the center of the metallic blocks 226. The longitudinal grooves 220 and the transverse grooves 222 can be formed by cutting, grinding, laser ablation, molding in the dielectric layer 224 during formation of the singulation substrate 104 of FIG. 1, or created in the dielectric layer 224 through a process such as deposition of resist as the dielectric layer 224, masking, exposure or patterning of the resist, and removal of the mask, for example. For simplicity, the formation process will be described as cutting, but it is understood that other aforementioned techniques are possible. The corners of the metallic blocks 226 are shown with dotted lines to indicate that they are covered by the dielectric layer 224. The longitudinal grooves 220 and the transverse grooves 222 are cut in the dielectric layer 224 only, and are not cut in the metallic blocks 226.

The longitudinal grooves 220 are cut to follow the air flow direction 114 as air is vented out of the mold chase 108 of FIG. 1. The air flow direction 114 is shown with the solid arrows. The orientation of the longitudinal grooves 220 is defined as the same orientation as the air flow direction 114. The orientation of the transverse grooves 222 is defined as perpendicular to the longitudinal grooves 220. Thus, the longitudinal grooves 220 and the transverse grooves 222 cross at 90 degree angles to each other and together form a grid pattern in the dielectric layer 224. The longitudinal grooves 220 are all parallel to each other. The transverse grooves 222 are all perpendicular to the longitudinal grooves 220 but parallel to each other.

It has been discovered that the transverse grooves 222 oriented perpendicular to the longitudinal grooves 220 in the dielectric layer 224 reduce the incidence of trapped air pockets due to improved air ventilation. As air is ventilated in the direction of the longitudinal grooves 220, the transverse grooves 222 in the dielectric layer 224 can improve overall air flow. For example, if there are local obstructions down one channel of the longitudinal grooves 220, the transverse grooves 222 near the obstruction can redirect air flow to a clear channel. Also for example, the transverse grooves 222 can redirect air flow to balance air flow down all of the longitudinal grooves 220 so that local spots of high or low air pressure do not cause problems with overall air flow in the air flow direction 114. The redirected air flow through the transverse grooves 222 can maximize air flow no matter what form the leading edge of the molding compound 106 of FIG. 1 takes, as it is not a given that the leading edge of the molding compound 106 being poured will flow as a straight edge. The maximized and balanced air flow due to the transverse grooves 222 will greatly decrease the incidence of trapped air pockets.

Figure 3:
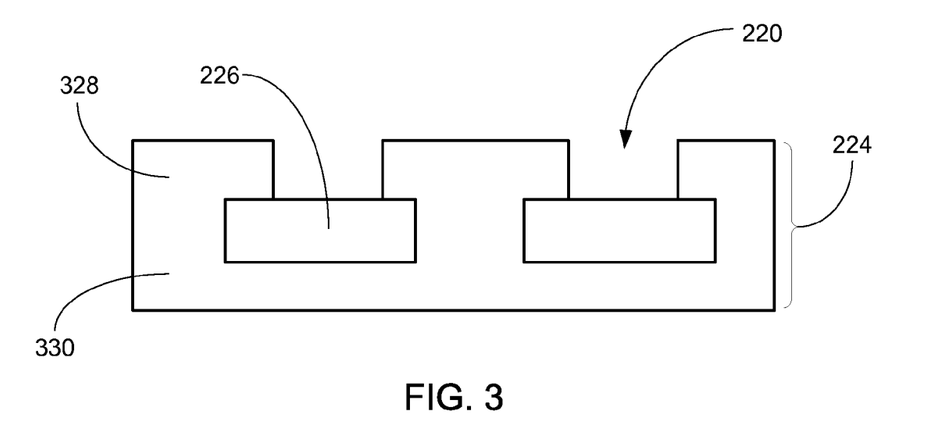
FIG. 3 is a cross-sectional view of the structure of FIG. 2 along the section line 3-3.

Referring now to FIG. 3, therein is shown a cross-sectional view of the structure of FIG. 2 along the section line 3-3. In this view, an upper dielectric portion 328 can be seen above a lower dielectric portion 330, with both portions being portions of the dielectric layer 224.

The upper dielectric portion 328 is defined as the portion of the dielectric layer 224 above a plane defined by the top surface of the metallic blocks 226. The longitudinal grooves 220 can be seen cut into only the upper dielectric portion 328, exposing the top surface of the metallic blocks 226. The lower dielectric portion 330 of the dielectric layer 224 is the portion of the dielectric layer 224 that is not the upper dielectric portion 328. The metallic blocks 226 can be embedded in the lower dielectric portion 330 of the dielectric layer 224.

It has been discovered that cutting the longitudinal grooves 220 and the transverse grooves 222 in the dielectric layer 224 over the metallic blocks 226 simplifies manufacturing and lowers cost. For example, because of the difference in hardness, chemical makeup, and reflective properties of the dielectric layer 224 and the metallic blocks 226, removal processes can be tailored to selectively remove only the dielectric layer 224. As an example, if a mask and etch process is used, an etchant selective for the dielectric layer 224 can easily be stopped once the metallic blocks 226 are exposed. As another example, because the metallic blocks 226 are electrically conductive while the dielectric layer 224 is an insulator, a saw designed to cut only until a conductive material is contacted can be used to cut through the dielectric layer 224. A large amount of control over the process for cutting the longitudinal grooves 220 and the transverse grooves 222 is gained by exploiting the differences between the metallic blocks 226 and the dielectric layer 224.

Figure 4:
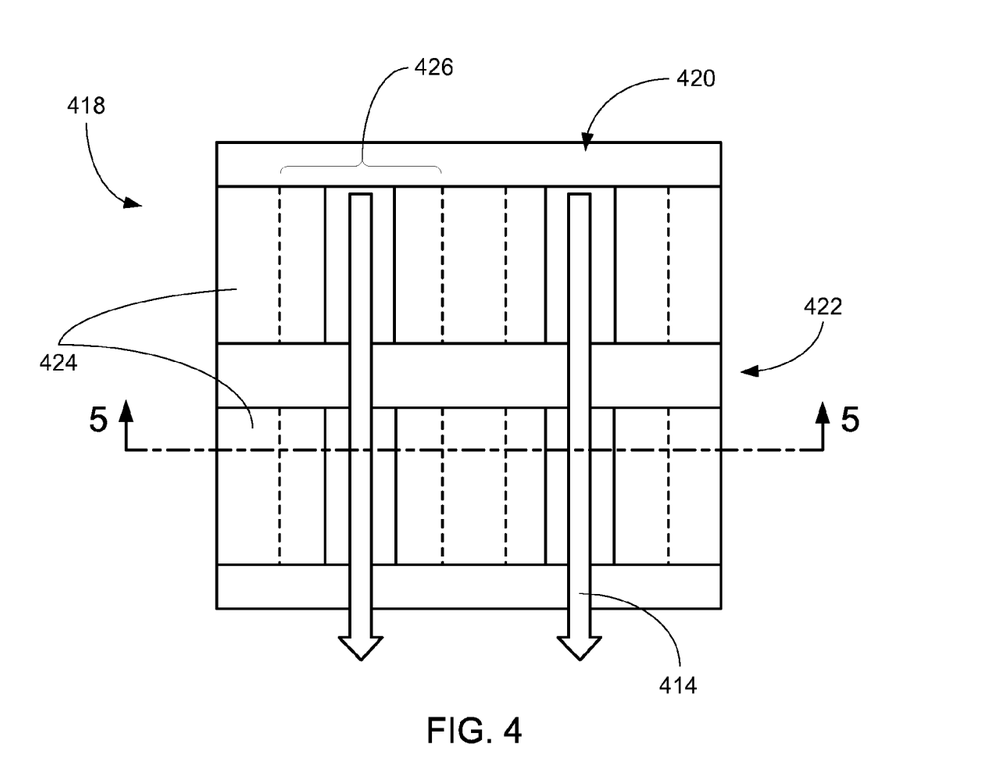
FIG. 4 is a top view of a portion of an air vent portion in a second embodiment of the present invention.

Referring now to FIG. 4, therein is shown a top view of a portion of an air vent portion 418 in a second embodiment of the present invention. In this view, longitudinal grooves 420 and transverse grooves 422 can be seen in a dielectric layer 424. It is understood that only a small portion of the air vent portion 418 is shown, and that the pattern can be repeated as necessary to fill all of the air vent portion 418. The air vent portion 418 can be a portion of the singulation substrate 104 of FIG. 1 for positioning within the air vent 110 of FIG. 1, for example. The longitudinal grooves 420 and the transverse grooves 422 can correspond to the grooves 116 of FIG. 1.

In portions of the singulation substrate 104 which have no electrical function (for example, for portions unconnected to any of the integrated circuit dies 102 of FIG. 1), a dummy pattern can be formed inside the dielectric layer 424. The dielectric layer 424 can be a material such as a prepreg composite, a solder resist, or other insulative material, for example. In this example, the dummy pattern is a grid of metallic blocks 426 which can serve to improve stiffness while also preventing thermal expansion and contraction issues. The dielectric layer 424 is formed entirely around the metallic blocks 426.

The metallic blocks 426 in this example are made of copper, but it is understood that any metal may be used as necessary. The dummy pattern in this example is a grid of the metallic blocks 426 unconnected to each other, but it is understood that the dummy pattern can be formed differently. For example, the dummy pattern can be a grid of circular metallic pads, a continuous metallic grid oriented in any direction, or any other regular pattern.

The longitudinal grooves 420 and the transverse grooves 422 are formed in the dielectric layer 424 to intersect between the metallic blocks 426. The longitudinal grooves 420 and the transverse grooves 422 can be formed by cutting, grinding, laser ablation, or molded in the dielectric layer 424 during formation of the singulation substrate 104, for example. For simplicity, the formation process will be described as cutting, but it is understood that other aforementioned techniques are possible. The left and right edges of the metallic blocks 426 are shown with dotted lines to indicate that they are covered by the dielectric layer 424. The longitudinal grooves 420 are cut in the dielectric layer 424 to pass over the metallic blocks 426, but the transverse grooves 422 are cut to pass between the metallic blocks 426. The longitudinal grooves 420 and the transverse grooves 422 are cut in the dielectric layer 424 only, and are not cut in the metallic blocks 426.

The longitudinal grooves 420 are cut to follow the air flow direction 414 as air is vented out of the mold chase 108 of FIG. 1. The air flow direction 414 is shown with the solid arrows. The orientation of the longitudinal grooves 420 is defined as the same orientation as the air flow direction 414. The orientation of the transverse grooves 422 is defined as perpendicular to the longitudinal grooves 420. Thus, the longitudinal grooves 420 and the transverse grooves 422 cross at 90 degree angles to each other and together form a grid pattern in the dielectric layer 424. The longitudinal grooves 420 are all parallel to each other. The transverse grooves 422 are all perpendicular to the longitudinal grooves 420 but parallel to each other.

It has been discovered that the transverse grooves 422 oriented perpendicular to the longitudinal grooves 420 in the dielectric layer 424 reduce the incidence of trapped air pockets due to improved air ventilation. As air is ventilated in the direction of the longitudinal grooves 420, the transverse grooves 422 in the dielectric layer 424 can improve overall air flow. For example, if there are local obstructions down one channel of the longitudinal grooves 420, the transverse grooves 422 near the obstruction can redirect air flow to a clear channel. Also for example, the transverse grooves 422 can redirect air flow to balance air flow down all of the longitudinal grooves 420 so that local spots of high or low air pressure do not cause problems with overall air flow in the air flow direction 414. The redirected air flow through the transverse grooves 422 can maximize air flow no matter what form the leading edge of the molding compound 106 of FIG. 1 takes, as it is not a given that the leading edge of the molding compound 106 being poured will flow as a straight edge. The maximized and balanced air flow due to the transverse grooves 422 will greatly decrease the incidence of trapped air pockets.

Figure 5:
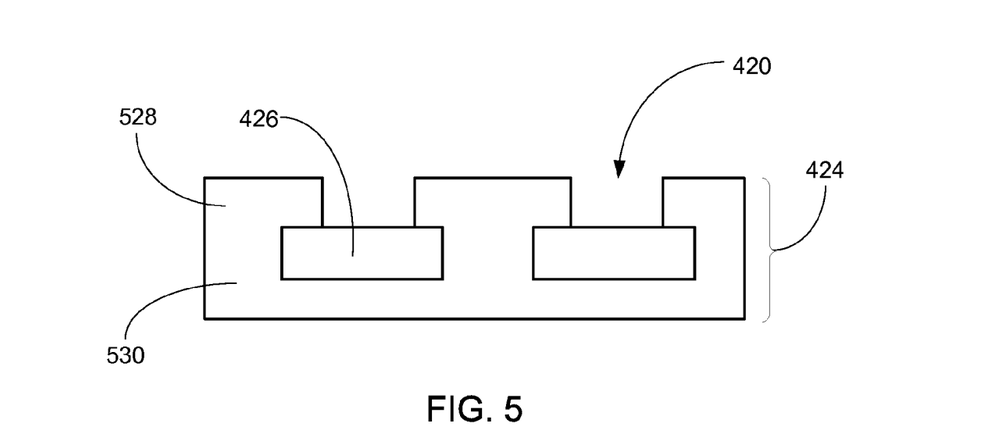
FIG. 5 is a cross-sectional view of the structure of FIG. 4 along the section line 5-5.

Referring now to FIG. 5, therein is shown a cross-sectional view of the structure of FIG. 4 along the section line 5-5. In this view, an upper dielectric portion 528 can be seen above a lower dielectric portion 530, with both portions being portions of the dielectric layer 424.

The upper dielectric portion 528 is defined as the portion of the dielectric layer 424 above a plane defined by the top surface of the metallic blocks 426. The longitudinal grooves 420 can be seen cut into only the upper dielectric portion 528, exposing the top surface of the metallic blocks 426. The lower dielectric portion 530 of the dielectric layer 424 is the portion of the dielectric layer 424 that is not the upper dielectric portion 528. The metallic blocks 426 can be embedded in the lower dielectric portion 530 of the dielectric layer 424.

It has been discovered that cutting the longitudinal grooves 420 and the transverse grooves 422 in the dielectric layer 424 over the metallic blocks 426 simplifies manufacturing and lowers cost. For example, because of the difference in hardness, chemical makeup, and reflective properties of the dielectric layer 424 and the metallic blocks 426, removal processes can be tailored to selectively remove only the dielectric layer 424. As an example, if a mask and etch process is used, an etchant selective for the dielectric layer 424 can easily be stopped once the metallic blocks 426 are exposed. As another example, because the metallic blocks 426 are electrically conductive while the dielectric layer 424 is an insulator, a saw designed to cut only until a conductive material is contacted can be used to cut through the dielectric layer 424. A large amount of control over the process for cutting the longitudinal grooves 420 and the transverse grooves 422 is gained by exploiting the differences between the metallic blocks 426 and the dielectric layer 424.

Figure 6:
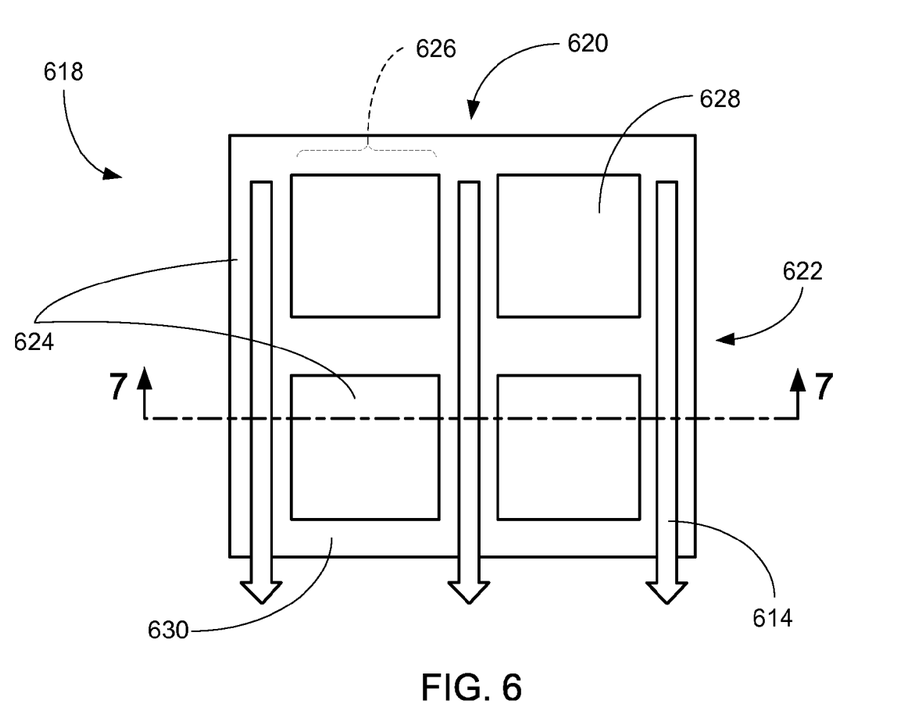
FIG. 6 is a top view of a portion of an air vent portion in a third embodiment of the present invention.

Referring now to FIG. 6, therein is shown a top view of a portion of the air vent portion 618 in a third embodiment of the present invention. In this view, longitudinal grooves 620 and transverse grooves 622 can be seen in a dielectric layer 624. It is understood that only a small portion of the air vent portion 618 is shown, and that the pattern can be repeated as necessary to fill all of the air vent portion 618. The air vent portion 618 can be a portion of the singulation substrate 104 of FIG. 1 for positioning within the air vent 110 of FIG. 1, for example. The longitudinal grooves 620 and the transverse grooves 622 can correspond to the grooves 116 of FIG. 1.

In portions of the singulation substrate 104 which have no electrical function (for example, for portions unconnected to any of the integrated circuit dies 102 of FIG. 1), a dummy pattern can be formed inside the dielectric layer 624. The dielectric layer 624 can be a material such as a prepreg composite, a solder resist, or other insulative material, for example. In this example, the dummy pattern is a grid of metallic blocks 626 which can serve to improve stiffness while also preventing thermal expansion and contraction issues. In this example, the metallic blocks 626 are not visible, but are directly under portions of the dielectric layer 624. The metallic blocks are indicated with dotted lead lines to indicate that they are completely covered by the dielectric layer 624. The dielectric layer 624 is formed entirely around the metallic blocks 626.

The metallic blocks 626 in this example are made of copper, but it is understood that any metal may be used as necessary. The dummy pattern in this example is a grid of the metallic blocks 626 unconnected to each other, but it is understood that the dummy pattern can be formed differently. For example, the dummy pattern can be a grid of circular metallic pads, a continuous metallic grid oriented in any direction, or any other regular pattern.

The longitudinal grooves 620 and the transverse grooves 622 are formed in the dielectric layer 624 to intersect between the metallic blocks 626. The longitudinal grooves 620 and the transverse grooves 622 can be formed by cutting, grinding, laser ablation, or molded in the dielectric layer 624 during formation of the singulation substrate 104, for example. For simplicity, the formation process will be described as cutting, but it is understood that other aforementioned techniques are possible. The longitudinal grooves 620 and the transverse grooves 622 are cut in the dielectric layer 624 only, and are not cut in the metallic blocks 626. An upper dielectric portion 628 of the dielectric layer 624 can be seen over the metallic blocks 626, and a lower dielectric portion 630 of the dielectric layer 624 can be seen within the areas exposed by the longitudinal grooves 620 and the transverse grooves 622. The upper dielectric portion 628 is defined as the portion of the dielectric layer 624 above a plane defined by a top surface of the metallic blocks 626. The lower dielectric portion 630 of the dielectric layer 624 is the portion of the dielectric layer 624 that is not the upper dielectric portion 628.

The longitudinal grooves 620 are cut to follow the air flow direction 614 as air is vented out of the mold chase 108 of FIG. 1. The air flow direction 614 is shown with the solid arrows. The orientation of the longitudinal grooves 620 is defined as the same orientation as the air flow direction 614. The orientation of the transverse grooves 622 is defined as perpendicular to the longitudinal grooves 620. Thus, the longitudinal grooves 620 and the transverse grooves 622 cross at 90 degree angles to each other and together form a grid pattern in the dielectric layer 624. The longitudinal grooves 620 are all parallel to each other. The transverse grooves 622 are all perpendicular to the longitudinal grooves 620 but parallel to each other.

It has been discovered that the transverse grooves 622 oriented perpendicular to the longitudinal grooves 620 in the dielectric layer 624 reduce the incidence of trapped air pockets due to improved air ventilation. As air is ventilated in the direction of the longitudinal grooves 620, the transverse grooves 622 in the dielectric layer 624 can improve overall air flow. For example, if there are local obstructions down one channel of the longitudinal grooves 620, the transverse grooves 622 near the obstruction can redirect air flow to a clear channel. Also for example, the transverse grooves 622 can redirect air flow to balance air flow down all of the longitudinal grooves 620 so that local spots of high or low air pressure do not cause problems with overall air flow in the air flow direction 614. The redirected air flow through the transverse grooves 622 can maximize air flow no matter what form the leading edge of the molding compound 106 of FIG. 1 takes, as it is not a given that the leading edge of the molding compound 106 being poured will flow as a straight edge. The maximized and balanced air flow due to the transverse grooves 622 will greatly decrease the incidence of trapped air pockets.

Figure 7:
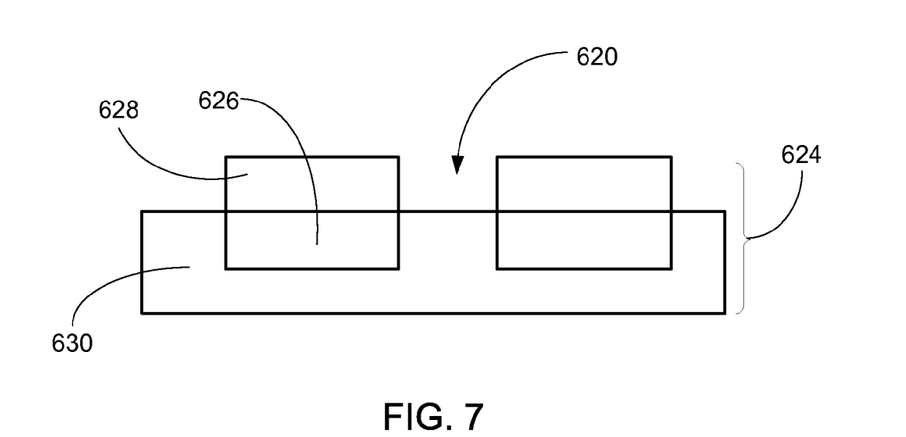
FIG. 7 is a cross-sectional view of the structure of FIG. 6 along the section line 7-7.

Referring now to FIG. 7, therein is shown a cross-sectional view of the structure of FIG. 6 along the section line 7-7. In this view, the upper dielectric portion 628 can be seen above the lower dielectric portion 630, with both portions being portions of the dielectric layer 624.

The longitudinal grooves 620 can be seen cut into only the upper dielectric portion 628, exposing the top surface of the metallic blocks 626. The metallic blocks 626 can be embedded in the lower dielectric portion 630 of the dielectric layer 624. In this embodiment, the metallic blocks 626 are fully covered on the top surface by the upper dielectric portion 628.

Figure 8:
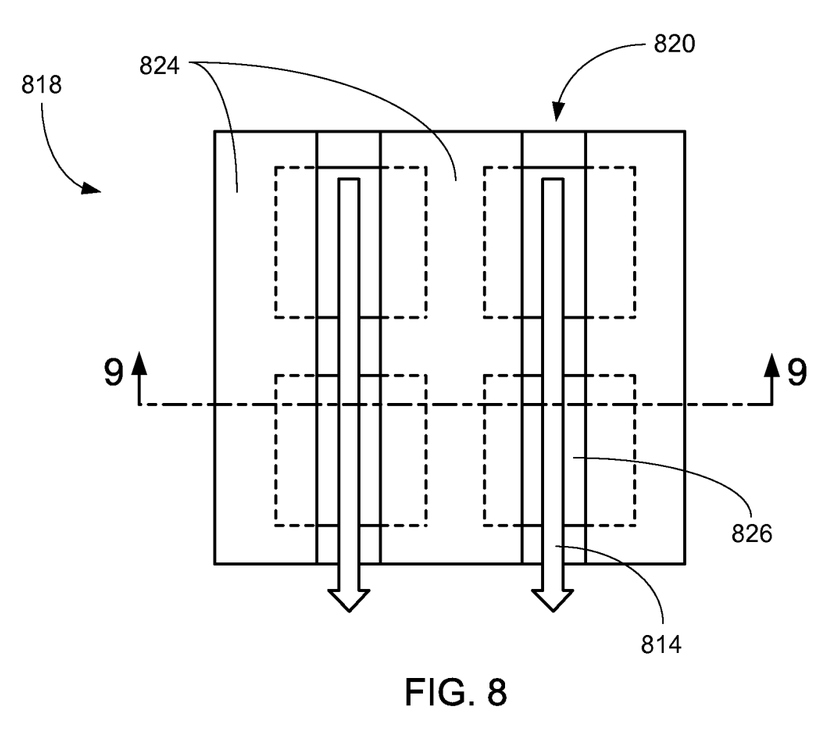
FIG. 8 is a top view of a portion of an air vent portion in a fourth embodiment of the present invention.

Referring now to FIG. 8, therein is shown a top view of a portion of the air vent portion 818 in a fourth embodiment of the present invention. In this view, longitudinal grooves 820 can be seen in a dielectric layer 824. It is understood that only a small portion of the air vent portion 818 is shown, and that the pattern can be repeated as necessary to fill all of the air vent portion 818. The air vent portion 818 can be a portion of the singulation substrate 104 of FIG. 1 for positioning within the air vent 110 of FIG. 1, for example. The longitudinal grooves 820 can correspond to the grooves 116 of FIG. 1.

In portions of the singulation substrate 104 which have no electrical function (for example, for portions unconnected to any of the integrated circuit dies 102 of FIG. 1), a dummy pattern can be formed inside the dielectric layer 824. The dielectric layer 824 can be a material such as a prepreg composite, a solder resist, or other insulative material, for example. In this example, the dummy pattern is a grid of metallic blocks 826 which can serve to improve stiffness while also preventing thermal expansion and contraction issues. The dielectric layer 824 is formed entirely around the metallic blocks 826.

The metallic blocks 826 in this example are made of copper, but it is understood that any metal may be used as necessary. The dummy pattern in this example is a grid of the metallic blocks 826 unconnected to each other, but it is understood that the dummy pattern can be formed differently. For example, the dummy pattern can be a grid of circular metallic pads, a continuous metallic grid oriented in any direction, or any other regular pattern.

The longitudinal grooves 820 are formed in the dielectric layer 824. The longitudinal grooves 820 can be formed by cutting, grinding, laser ablation, or molded in the dielectric layer 824 during formation of the singulation substrate 104, for example. For simplicity, the formation process will be described as cutting, but it is understood that other aforementioned techniques are possible. The left and right sides of the metallic blocks 826 are shown with dotted lines to indicate that they are covered by the dielectric layer 824. The longitudinal grooves 820 are cut in the dielectric layer 824 to pass over the metallic blocks. The longitudinal grooves 820 are cut in the dielectric layer 824 only, and are not cut in the metallic blocks 826.

The longitudinal grooves 820 are cut to follow the air flow direction 814 as air is vented out of the mold chase 108 of FIG. 1. The air flow direction 814 is shown with the solid arrows. The orientation of the longitudinal grooves 820 is defined as the same orientation as the air flow direction 814. The longitudinal grooves 820 are all parallel to each other.

Figure 9:
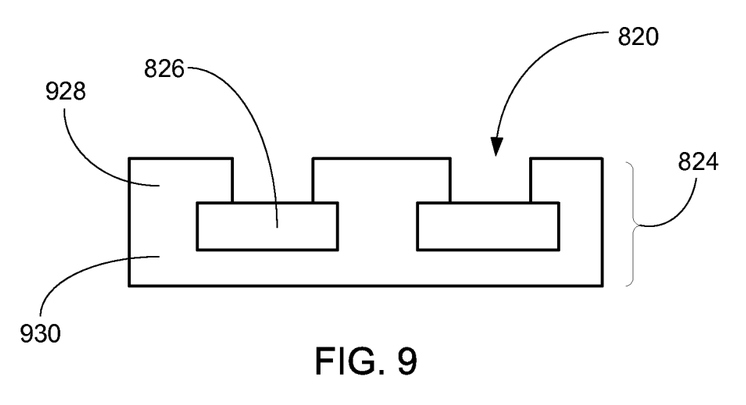
FIG. 9 is a cross-sectional view of the structure of FIG. 8 along the section line 9-9.

Referring now to FIG. 9, therein is shown a cross-sectional view of the structure of FIG. 8 along the section line 9-9. In this view, an upper dielectric portion 928 can be seen above a lower dielectric portion 930, with both portions being portions of the dielectric layer 824.

The upper dielectric portion 928 is defined as the portion of the dielectric layer 824 above a plane defined by the top surface of the metallic blocks 826. The longitudinal grooves 820 can be seen cut into only the upper dielectric portion 928, exposing the top surface of the metallic blocks 826. The lower dielectric portion 930 of the dielectric layer 824 is the portion of the dielectric layer 824 that is not the upper dielectric portion 928. The metallic blocks 826 can be embedded in the lower dielectric portion 930 of the dielectric layer 824.

It has been discovered that cutting the longitudinal grooves 820 in the dielectric layer 824 over the metallic blocks 826 simplifies manufacturing and lowers cost. For example, because of the difference in hardness, chemical makeup, and reflective properties of the dielectric layer 824 and the metallic blocks 826, removal processes can be tailored to selectively remove only the dielectric layer 824. As an example, if a mask and etch process is used, an etchant selective for the dielectric layer 824 can easily be stopped once the metallic blocks 826 are exposed. As another example, because the metallic blocks 826 are electrically conductive while the dielectric layer 824 is an insulator, a saw designed to cut only until a conductive material is contacted can be used to cut through the dielectric layer 824. A large amount of control over the process for cutting the longitudinal grooves 820 is gained by exploiting the differences between the metallic blocks 826 and the dielectric layer 824.

Figure 10:
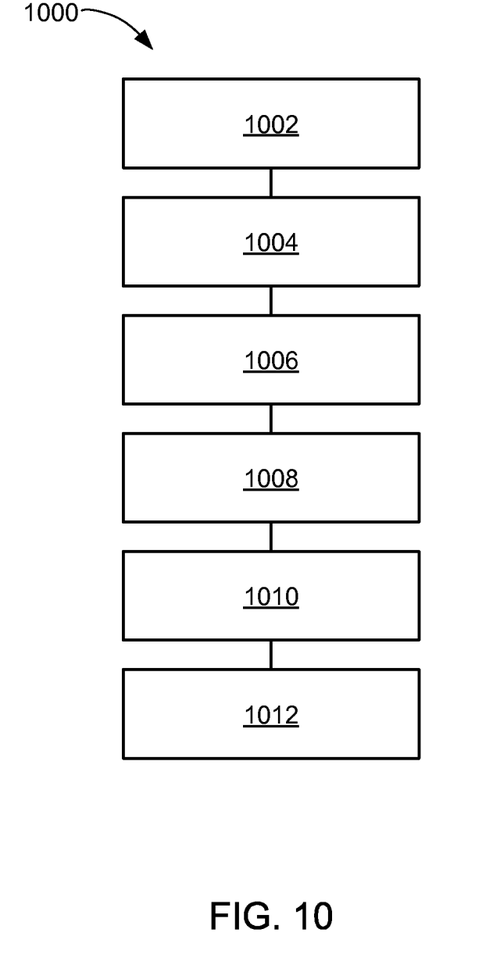
FIG. 10 is a flow chart of a method of manufacture of the integrated circuit packaging system in a further embodiment of the present invention.

Referring now to FIG. 10, therein is shown a flow chart of a method 1000 of manufacture of the integrated circuit packaging system 100 in a further embodiment of the present invention. The method 1000 includes: providing a mold chase having an air vent in a block 1002; providing a singulation substrate having an air vent portion in a block 1004; forming longitudinal grooves in the air vent portion of the singulation substrate, the longitudinal grooves all parallel to each other in a block 1006; positioning the singulation substrate in the mold chase in a block 1008; attaching an integrated circuit die to the singulation substrate in a block 1010; and flowing a molding compound on the singulation substrate and the integrated circuit die, the molding compound flowing over the air vent portion of the singulation substrate and into a portion of the longitudinal grooves, the molding compound pushing air out of the mold chase in the air flow direction through the longitudinal grooves in a block 1012.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a mold chase having an air vent;
   providing a singulation substrate having an air vent portion, a dielectric layer, and metallic blocks embedded in the dielectric layer;
   forming longitudinal grooves in the air vent portion of the singulation substrate, the longitudinal grooves all parallel to each other and oriented parallel to an air flow direction out of the mold chase;
   forming transverse grooves in the air vent portion and across the longitudinal grooves, the transverse grooves oriented perpendicular to the longitudinal grooves, the longitudinal grooves and the transverse grooves partially overlapping the metallic blocks;
   positioning the air vent portion of the singulation substrate within the air vent of the mold chase;

attaching an integrated circuit die to the singulation substrate; and flowing a molding compound on the singulation substrate and the integrated circuit die, the molding compound flowing over the air vent portion of the singulation substrate and into a portion of the longitudinal grooves, the molding compound pushing air out of the mold chase in the air flow direction through the longitudinal grooves.

2. The method as claimed in claim 1 wherein forming the longitudinal grooves includes cutting the longitudinal grooves in the dielectric layer and over the metallic blocks.

3. The method as claimed in claim 1 wherein forming the transverse grooves includes cutting the transverse grooves in the dielectric layer and over the metallic blocks.

4. The method as claimed in claim 1 wherein forming the transverse grooves includes cutting the transverse grooves in the dielectric layer and between the metallic blocks.

5. The method as claimed in claim 1 wherein forming the longitudinal grooves includes cutting the longitudinal grooves in the dielectric layer and between the metallic blocks.

6. An integrated circuit packaging system comprising:

a singulation substrate having an air vent portion having longitudinal grooves in the air vent portion, the longitudinal grooves all parallel to each other;

an integrated circuit die attached to the singulation substrate; and a molding compound on the singulation substrate, on the air vent portion, in a portion of the longitudinal grooves, and on the integrated circuit die;

a mold chase having an air vent, the singulation substrate positioned in the mold chase with the air vent portion in the air vent of the mold chase; and wherein: the air vent portion of the singulation substrate has transverse grooves across the longitudinal grooves, the transverse grooves oriented perpendicular to the longitudinal grooves;

the longitudinal grooves are oriented parallel to an air flow direction out of the mold chase; and the singulation substrate includes a dielectric layer and metallic blocks embedded in the dielectric layer and partially overlapping the longitudinal grooves, the transverse grooves.

7. The system as claimed in claim 6 wherein the longitudinal grooves are in the dielectric layer and over the metallic blocks.

8. The system as claimed in claim 6 wherein the transverse grooves are in the dielectric layer and over the metallic blocks.

9. The system as claimed in claim 6 wherein the longitudinal grooves are in the dielectric layer and between the metallic blocks.

10. The system as claimed in claim 6 wherein the transverse grooves are in the dielectric layer and between the metallic blocks.

* * * * *